United States Patent [19]

Berni et al.

[11] 4,241,428
[45] Dec. 23, 1980

[54] LINE COMPENSATED SEISMIC AMPLIFIER

[75] Inventors: Albert J. Berni, Houston, Tex.; John F. Parrish, New Orleans, La.

[73] Assignee: Shell Oil Company, Houston, Tex.

[21] Appl. No.: 4,638

[22] Filed: Jan. 19, 1979

[51] Int. Cl.³ ............... G01V 1/28; H04B 3/28; G01V 1/38
[52] U.S. Cl. ................. 367/21; 330/84; 330/258; 333/12; 367/65; 367/135; 367/152
[58] Field of Search ............ 330/84, 258; 367/20, 367/21, 65, 135, 155, 177; 333/12

[56] References Cited

U.S. PATENT DOCUMENTS

| | | |
|---|---|---|
| 3,118,126 | 1/1964 | Brock et al. |
| 3,351,898 | 11/1967 | Romberg |
| 3,469,255 | 9/1969 | Hoffman et al. |
| 3,863,200 | 1/1975 | Miller |
| 3,863,201 | 1/1975 | Briggs et al. |
| 3,939,468 | 2/1976 | Mastin .................. 367/65 |
| 3,972,020 | 7/1976 | Carroll et al. ........... 330/258 |

*Primary Examiner*—Howard A. Birmiel

[57] ABSTRACT

A seismic amplifier for use in marine seismic survey work involving the transmission of signals from remote signalling stations over cable pairs to signal processing equipment. These signalling stations are comprised of capacitive transducers. The seismic amplifier of the surveying system includes operational amplifiers electrically interconnected with a feedback circuit comprised of a balanced resistive-reactive network which is a lumped parameter equivalent circuit of the transmission line and capacitive transducer. The lumped parameter equivalent circuit used for feedback provides a flat, zero-phase shift overall response over the cable pair from the transducer to the output of a differential amplifier stage which is connected to the operational amplifier outputs to improve common mode rejection.

23 Claims, 16 Drawing Figures

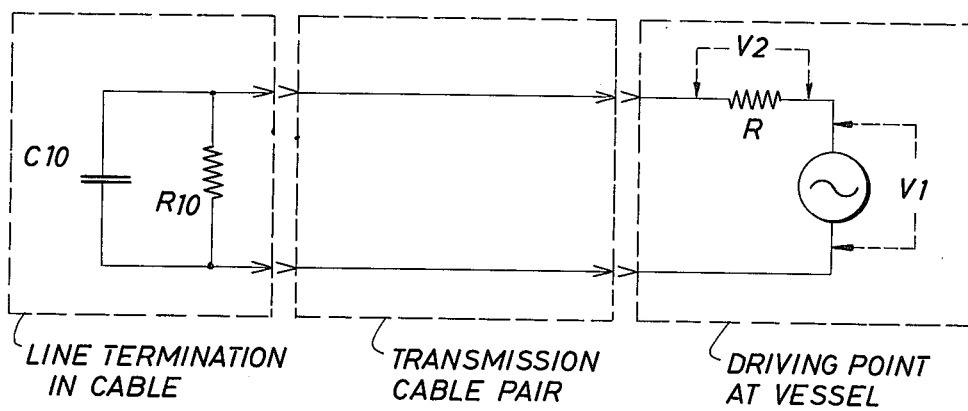
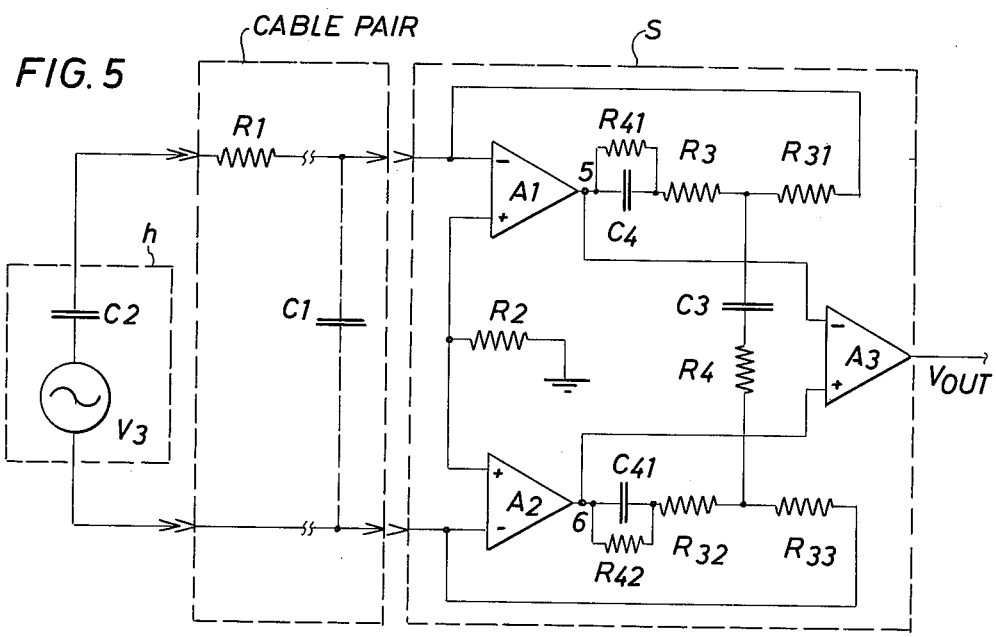
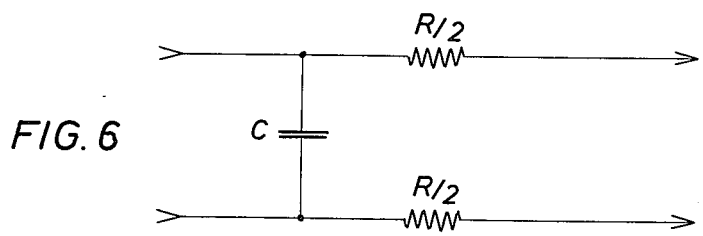

LINE COMPENSATED SEISMIC AMPLIFIER

CROSS-REFERENCES TO RELATED APPLICATIONS

An amplifier having properties similar to the seismic amplifier of the present invention is disclosed in copending application, Ser. No. 4,644, dated Jan. 19, 1979. One particular embodiment of the amplifier disclosed therein utilizes the balanced network of the present invention to provide signal compensation.

BACKGROUND OF THE INVENTION

In marine seismic surveys, a hydrophone cable is towed behind a survey vessel. The hydrophone cable is typically a lead-in cable and a series of seismic streamer sections each formed of an oil-filled plastic tube surrounding an array of hydrophones, strain cables, structural spacers, transformers, and mechanical and electrical leads or connectors. During a survey operation, the seismic streamer sections forming the seismic survey system are towed by the survey vessel at some selected depth below the ocean surface, by any of several means known in the art, such as the use of weighting or paravane structures. For example, 100 feet of hydrophone cable may contain 30 hydrophones whose outputs are combined to form a single hydrophone station signal. For this example, a 12,000-foot cable may contain 120 hydrophone stations. Each station is connected by its own transmission line, or cable pair, to a particular channel of the survey vessel recording instrument. Line lengths of the various hydrophone stations vary considerably. For example, on one survey vessel the cable pair length to the nearest station is 775 feet, while that to the farthest station is 12,695 feet. Each of the hydrophones in the array comprising the hydrophone station is customarily a piezoelectric ceramic capacitance transducer which responds to underwater sound pressure waves and converts such wave phenomena into electrical information, typically an output voltage proportional to the applied acoustic pressure. The cable pair carrying this electrical signal for each hydrophone station is not ideal but has a distributed finite conductivity. In addition, the separate conductors of the cable pair exhibit distributed capacitance between the leads. These characteristics cause the transmitted signal to undergo a frequency selective absorption and phase shift that increases with the length of cable that is traversed. Transformers have been used with varying degrees of success to alleviate the effects of the transmission line by lowering the source or load impedances attached to each cable pair. However, the output voltage on the transmission line is substantially reduced in this method. A loss of sensitivity can result and make some extraneous noise signals more pronounced in their effect.

Another method of reducing the load impedance on a transmission line has been the use of differential charge amplifiers, typified by U.S. Pat. No. 3,939,468 issued to Mastin. In this approach, a differential charge amplifier including two operational amplifiers each having parallel capacitive-resistive feedback loops is coupled to a differential voltage amplifier stage. This circuit has a very low differential input impedance thereby reducing the loss in sensitivity caused by the shunt impedance induced between the single conductors of a cable pair. A high common mode rejection ratio is achieved by using the differential voltage amplifier to cancel the balanced common mode charge response of the differential charge amplifier stage. However, the charge amplifier response in the seismic frequency band matches the output of the hydrophone only for short lengths of transmission line. It does not compensate for series resistance losses which increase with the length of the cable pairs, nor does it compensate for the actual distributed shunt capacitance between the cable pair conductors. Instead, it reduces the effect of total shunt impedance on the transmitted signal by maintaining the two inputs to the charge amplifier stage at approximately the same potential, thereby causing only a low voltage to be induced across the inputs and, hence, very little current flow through the distributed shunt capacitance or other shunt impedances between the single conductors of the cable pair. Subsequent adjustments must be made to compensate for the reduction in signal amplitude and changes in phase response as the frequency and distance increase.

Since the line lengths among the various hydrophone stations usually differ, the amplitude and phase responses can vary with station number. One method of overcoming this problem involves the addition of passive networks to each cable pair in order to equalize the frequency transfer function for all stations. The design philosophy being used is to make the transfer function for each station approximately the same as that of the station farthest from the survey vessel recording equipment. Once the transfer functions are equalized, subsequent filtering or digital data processing is required in order to complete the compensation so that within a desired frequency passband a flat, zero-phase shift seismic response is obtained from each station.

SUMMARY OF THE INVENTION

The present invention solves the above problems within a desired frequency passband by providing a seismic amplifier which can compensate for the effects of the transducer source impedance and the losses in the transmission line. A lumped parameter circuit which is an electrical equivalent of the transmission line and the source impedance of the seismic transducer is placed in the feedback circuit of a seismic amplifier in order to provide a flat, zero-phase shift overall response from the seismic transducer transmitting the proportional voltage signal to the output of the seismic amplifier.

The seismic amplifier is comprised of two amplifier stages: a first differential amplifier stage for the actual feedback compensation, and a second differential voltage amplifier stage for improving the common mode rejection. The first stage of the amplifier is made up of two operational amplifiers interconnected by a feedback circuit which contains a lumped parameter equivalent circuit of the cable pair and transducer being compensated. As a result of the fully compensated signal response within a known frequency passband, the recordings being made by the seismic vessel recording instruments can be scaled and calibrated in pressure units regardless of the varying length of transmission line and without the need of digital filter compensation.

BRIEF DESCRIPTION OF THE DRAWING

Other advantages and capabilities of the present invention will become apparent from the following detailed description of the preferred embodiment when taken in conjunction with the attached drawing.

FIG. 4 is a simplified schematic showing the cable pair parameter measurement method.

FIG. 5 is a simplified schematic of one embodiment of the seismic amplifier.

FIG. 6 is a schematic of a balanced-L type equalization network.

DESCRIPTION OF THE PREFERRED EMBODIMENTS

The first step in compensating for the varying line lengths is to find the distributed electrical circuit parameters for the cable pair to be compensated. For example, measurements similar to line input admittance tests may be made on a cable under tow in its normal operating configuration, schematically indicated in FIG. 4. The hydrophone station is replaced by an equivalent output impedance in the form of a resistor R10 and a capacitor C10 connected in parallel. Voltage measurements V2 and V1 are made on board the survey vessel, the ratio of V2 and V1 being a function of both the distributed line parameters and the hydrophone equivalent circuit. The magnitude of this ratio is calculated at different frequencies both for the station with the passive hydrophone equivalent circuit and with an actual hydrophone station. These results may be compared to a theoretical result calculated using equations given in *Communications Engineering*, Everitt and Anner, (1956), McGraw Hill Book Co., for a transmission line having a distributed shunt capacitance and distributed series resistance, and terminated with the same hydrophone equivalent circuit as shown in FIG. 4. In our example, a shunt capacitance of 33 picofarads/foot and a series resistance of 0.2 ohms/foot provided theoretical values in almost complete agreement with experimental measurements. Hence these values for the distributed capacitance and resistance serve as the basis to provide full compensation for the effects of a given cable pair.

Figure 9A:
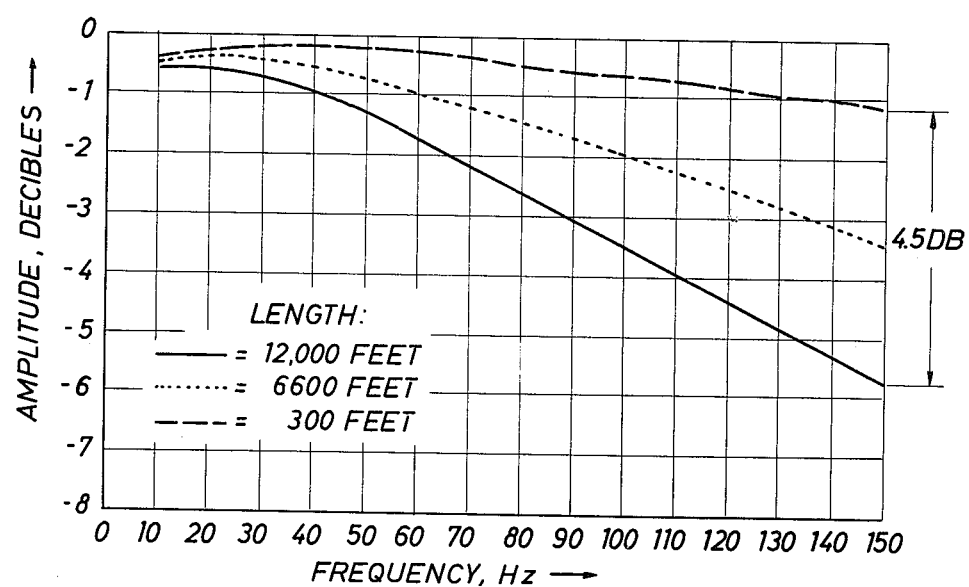
FIGS. 9A and 9B are graphic representations of the amplitude (decibels) and phase (degrees) responses of a seismic surveying system using no equalization.
Figure 9B:
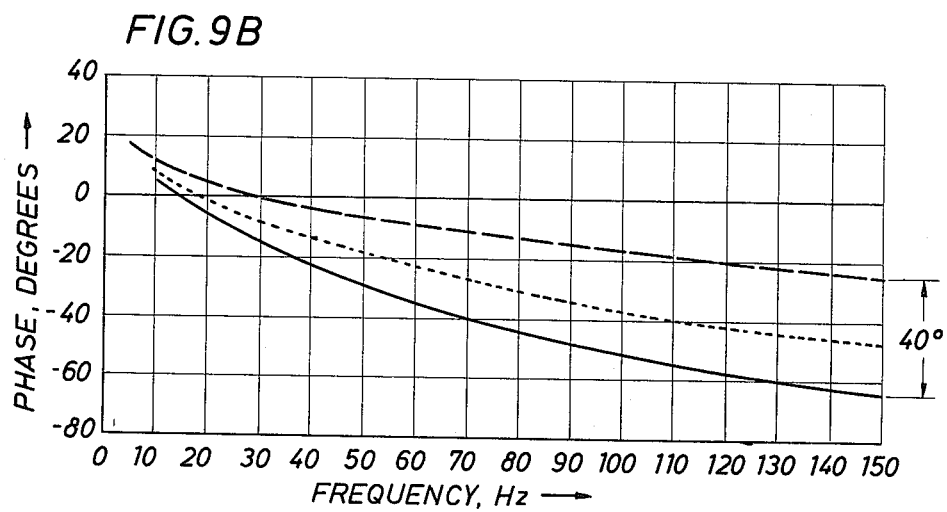
Figure 10A:
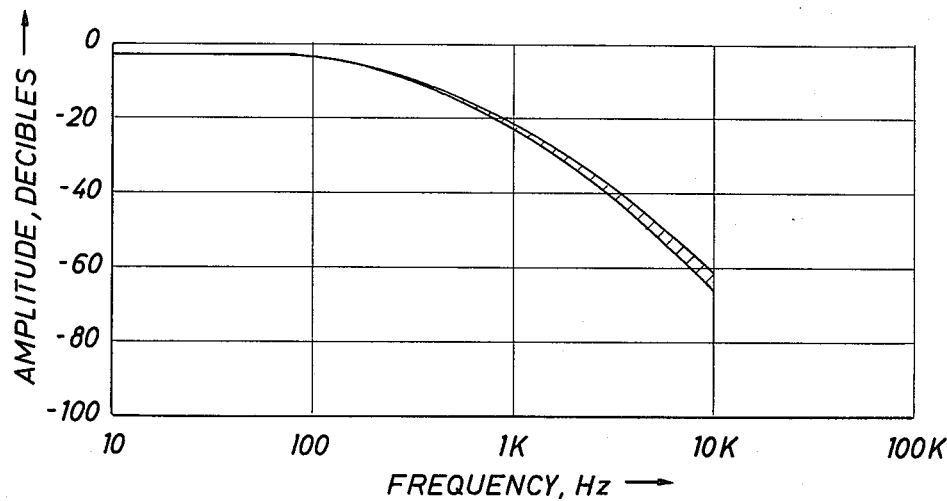
FIGS. 10A and 10B are graphic representations of the amplitude and phase responses of a seismic surveying system utilizing a balanced-T equalization network at the input to an amplifier.
Figure 10B:
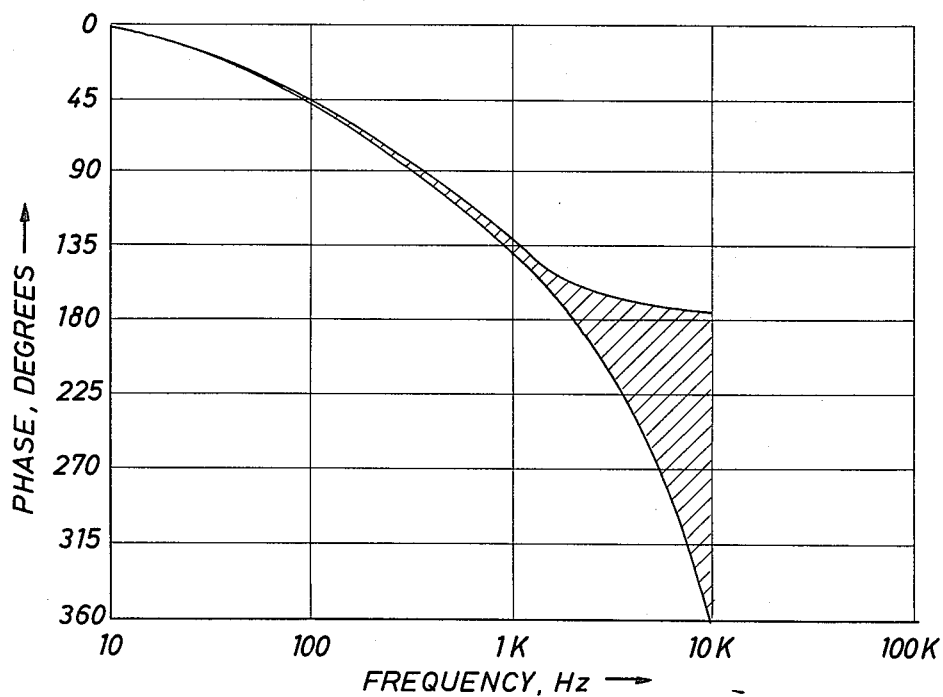

Referring to FIGS. 9A and 9B, the amplitude and phase diagrams for the seismic survey system with no equalization indicate a substantial variation between the response for a 300-foot cable pair and the response for a 12,000-foot cable pair. At a frequency of 150 Hz there is more than a four decibel amplitude difference and a 40° phase difference between the envelopes for the shortest to the longest cable pairs. By placing a balanced-T equalization network of the type shown in FIG. 7 at the input to an amplifier similar to one described by Mastin in U.S. Pat. No. 3,939,468, with capacitance C calculated at 33 picofarads/foot and sum of the resistances R/4 calculated at 0.2 ohms/foot for each foot of cable pair length less than 12,000 feet, the more limited range of responses of FIGS. 10A and 10B results. At 125 Hz, the amplitude difference of the envelope has been reduced to 0.1 db and the phase difference has been reduced to 1.2° for cable lengths ranging from 300 to 12,000 feet. However, digital filtering is still necessary to compensate for the overall phase lag and amplitude drop.

Figure 7:
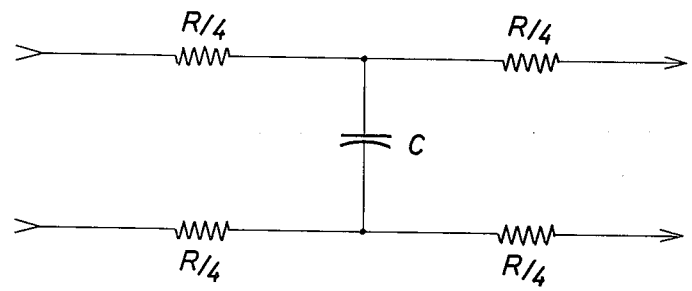
FIG. 7 is a schematic of a balanced-T type equalization network.
Figure 8:
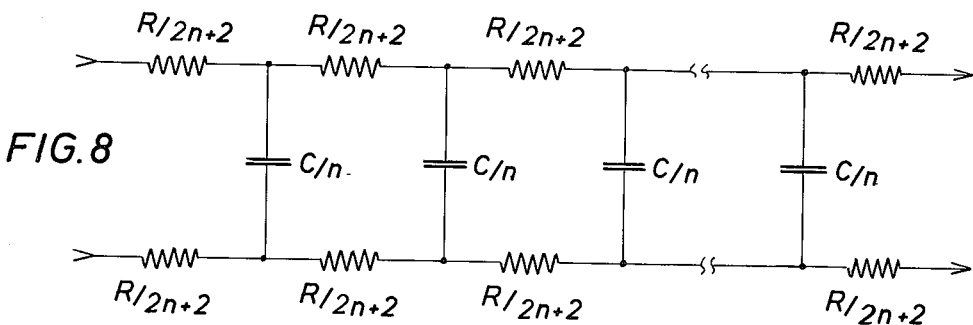
FIG. 8 is a schematic of a cascaded balanced-T type network with n stages.

By simplifying the equalization network to a balanced-L network as shown in FIG. 6, the envelopes of the amplitude and phase diagrams increase in width, making the response less desirable due to a wider variation with cable length. However, fewer electrical components are required, thus reducing manufacturing costs. By making the equalization network more complex, as in the cascaded balanced-T network of n stages shown in FIG. 8, the envelope becomes still more narrow and it extends to higher frequencies than the response obtained with the single balanced-T network of the above example. However, more components are required, thus increasing the manufacturing costs. It should be recognized that a balance may be reached between the amount of response variation from the equalization networks, as shown in FIGS. 6–8, and the manufacturing costs associated with the various networks.

Instead of making all throughput transfer functions equal to that of the farthest station, as was done with the equalization networks of the above example, the alternative design philosophy of the present invention makes the throughput transfer function of all channels equal to that which is obtained with a zero length transmission line. The seismic amplifier of FIG. 5 results from application of this philosophy, which ideally makes all of the transfer responses thereby obtained flat at 0 decibels and 0 degrees, consistent with the theory set forth below.

Figure 11A:
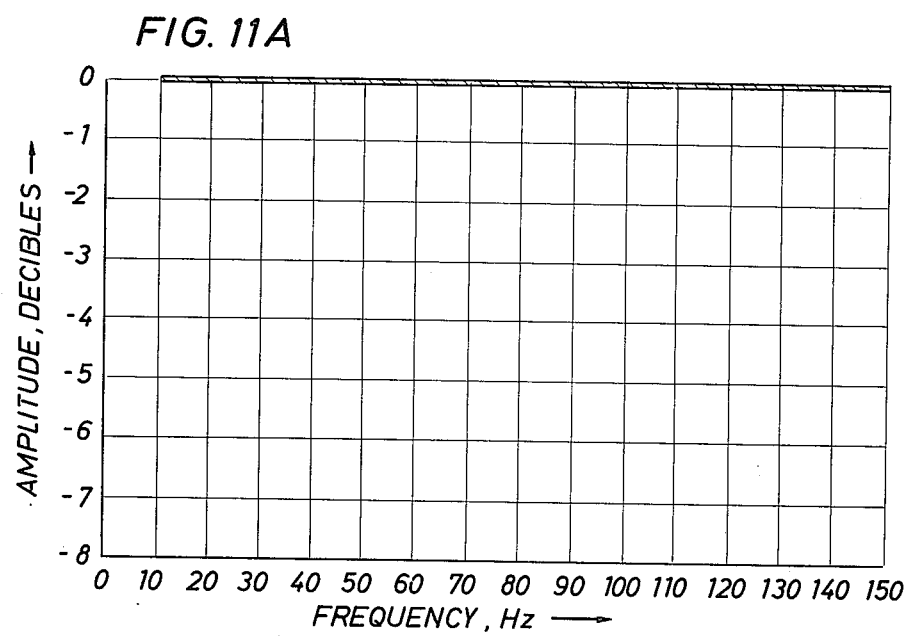
FIGS. 11A and 11B are graphic representations of the amplitude and phase responses of a seismic surveying system comprised of a seismic amplifier of the type described by the present invention.
Figure 11B:
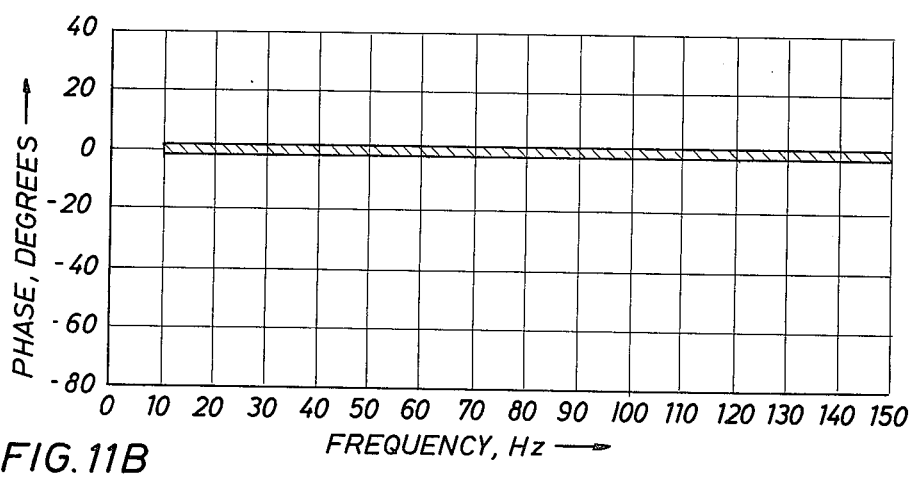

Referring now to FIG. 5, there is shown in schematic form a seismic surveying system that has a single hydrophone station h, the equivalent circuit of which is represented by a voltage source V3 and a capacitor C2 electrically connected in series. The line or cable pair distributed series resistance from the hydrophone station h to the seismic amplifier S is represented by the resistance R1, and the distributed shunt capacitance between the conductors of the cable pair is represented by capacitor C1. The cable pair is connected to the seismic amplifier S at the negative input terminals of a pair of operational amplifiers A1 and A2. The resistive-reactive combination of impedance in the feedback circuit of seismic amplifier S is indicated by the series combination of capacitor C4 and resistors R3 and R31 in the feedback loop of operational amplifier A1 connected from its output to its negative polarity input, capacitor C41 and resistors R32 and R33 connected in series in the feedback loop of operational amplifier A2 from its output to its negative polarity input, and the series resistive-capacitive impedance of C3 and R4. The last-mentioned series arrangement interconnects the respective series feedback loops of the operational amplifiers. Resistors R3, R31, R32 and R33 and capacitor C3 form a balanced-T network, an equivalent circuit for the transmission line, which has been placed in the feedback circuit. Capacitors C4 and C41 in the respective series feedback loops of operational amplifiers A1 and A2 place an equivalent of the hydrophone capacitance in the feedback circuit of the seismic amplifier S. Resistors R41 and R42 may be connected in parallel with capacitors C4 and C41 respectively, to improve the DC stability of the seismic amplifier, further explained below. The resistance connecting the positive polarity input pair of the operational amplifiers to ground potential is depicted by R2, and the positive and negative polarity inputs of the differential amplifier stage A3 are connected to the outputs of the operational amplifiers A1 and A2. Using the data obtained from the above example with the sum of the resistances R3, R31, R32 and R33 calculated at 0.2 ohms/foot and C3 calculated at 33 picofarads/foot, the experimentally measured amplitude and phase envelopes of FIGS. 11A and 11B result from applying signals at different frequencies to the compensated cable pair. For example, in a cable pair with a length of 10,000 feet, distributed shunt capacitance C1 equals 0.33 microfarads and series resistance R1 equals 2,000 ohms, hence C3 equals 0.33 microfarads and R3, R31, R32 and R33 each equal one-fourth of R1, or 500 ohms. At frequencies above 10 Hz and less than 125 Hz, the deviation from an ideal flat response is less than 0.06 decibels and 1.2 degrees. Excellent response continues to frequencies up to 500 Hz. With the seismic amplifier of FIG. 5, no further digital filtering is required in order to calibrate the records in pressure units.

With typical operational amplifiers for A1 and A2, the circuit of FIG. 5 without resistance R4 would oscillate. The condition for stability is that the transfer functions around the feedback loops including the effects of A1 and A2 must be less than 0 decibels when the phase function is 0 degrees. One method for achieving stability is to use phase shift compensation. The addition of a resistor R4 in series with the capacitor C3 gives phase lead in the feedback transfer function at higher frequencies. Since the addition of resistor R4 distorts the overall response, a value must be chosen that does not appreciably affect the throughput transfer function below 500 Hz. R4 is chosen to be less than the impedance of C3 in the frequency range of interest. For instance, an upper frequency limit of 2,000 Hz may be chosen so that it is well outside the affected frequency range, so that $$R4 = \frac{1}{2\pi f(C3)} = \frac{1}{2\pi (2000) C3} = 240 \text{ ohms}$$

where the term on the right is equal to the magnitude of the impedance of C3 at a frequency of 2,000 Hz. In this example, a value for R4 of 240 ohms is satisfactory for a 10,000 foot cable with distributed capacitance of 33 picofarads/foot. It should be clear that other equally successful methods of preventing oscillation are available. For instance, the high frequency gain of the operational amplifier may be reduced by internal compensation or by placing an external voltage divider at its output, whereby the feedback signal is reduced in magnitude.

The DC stability of the seismic amplifier in FIG. 5 may be improved by adding resistors R41 and R42 in parallel with capacitors C4 and C41 respectively. These resistors also distort the overall response but a value can be chosen that does not appreciably affect the throughput transfer function above 10 Hz. For example, a typical station array of 30 hydrophone elements can have an effective capacitance of 0.5 microfarad. Hence, capacitors C4 and C41 will have a value of 1.0 microfarad each. Selecting a value for the parallel resistance which equals the value of the reactance of the capacitor at 2 Hz results in a value of 79.5 K ohms for resistors R41 and R42.

In principle each seismic amplifier can be designed to compensate precisely for the cable pair to which it is attached. However, it can be more practical to equalize groups of transmission line cable pairs with balanced networks or lumped parameter equivalent circuits, such as those shown in FIGS. 6-8. These balanced networks are placed at the inputs of each seismic amplifier. The seismic amplifier of the present invention, as shown in FIG. 5, may then be used to compensate for the longest length cable pair in the group. In this way, the equalization networks at the respective cable pair terminations will vary with the line length but the seismic amplifier will remain uniform for each group of cable pairs. Any seismic amplifier is thus adaptable to any equalized line in the group and it can be tested by comparison or substitution with another identical seismic amplifier.

By simplifying or cascading the balanced networks as shown in FIGS. 6-8 and placing their equivalents in the seismic amplifier feedback circuit, an increase or decrease in degree of compensation may be obtained, as previously mentioned when equalizing the various cable pairs. However, there will be a corresponding change in manufacturing costs. For instance, by cascading the balanced-T networks to form the circuit of FIG. 8 in the feedback circuits of the seismic amplifiers, excellent compensation results are obtained well beyond 500 Hz, but a substantial increase in manufacturing costs can also occur.

Figure 1:
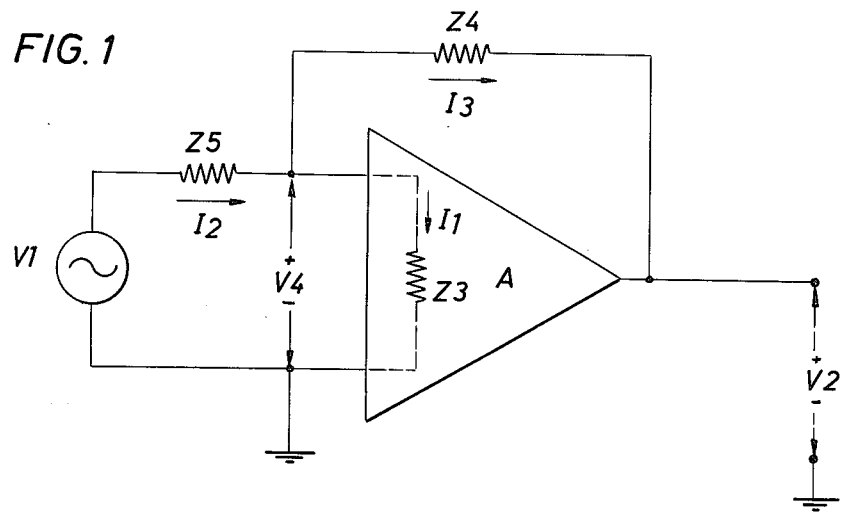
FIG. 1 is a simplified schematic of a typical operational amplifier with negative feedback.

Referring now to FIG. 1, the theory behind the present invention will be described. In operational amplifier theory, impedance Z3 and the amplifier gain may be assumed infinite for analysis purposes. The current relationship at node 1 is then $$I2 - I3 = I1, \text{ but since } I1 = 0, I2 = I3.$$

Node 1 is therefore at virtual ground, since $V4=0$. If $V4=0$, then it follows that $V1/I2=Z5$ and $V2/-I3=Z4$. If $Z4$ is made to equal $Z5$, then $V1=-V2$, with no change in amplitude or phase angle. The circuit in FIG. 1 will exhibit voltage gain without a phase shift if the ratio, $G=(Z4/Z5)$, is made equal to a positive real number within the desired frequency passband. The response function, $G$, can be adjusted at low frequencies and high frequencies in order to stabilize the circuit or to effect a desired passband or reject band shape.

Figure 2A:
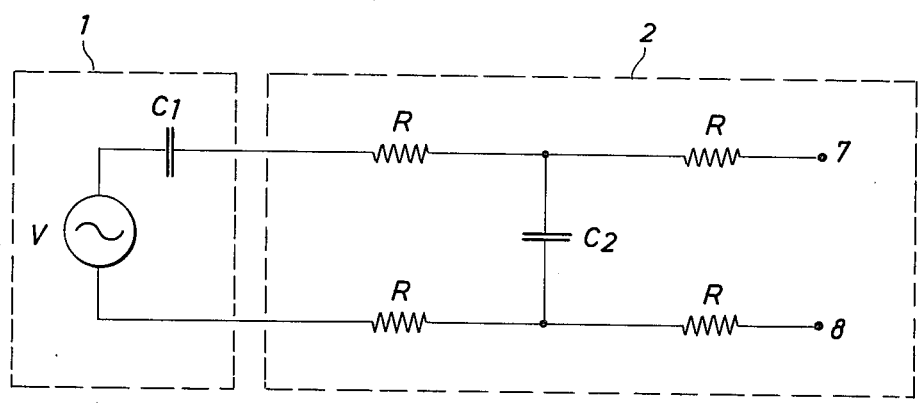
FIG. 2A is a schematic of a lumped parameter equivalent circuit for a cable pair attached to a capacitive transducer.
Figure 2B:
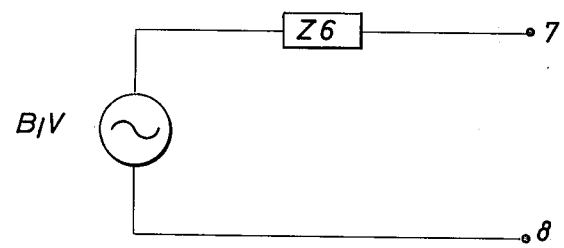
FIG. 2B is the Thevenin equivalent of the circuit in FIG. 2A.
Figure 3A:
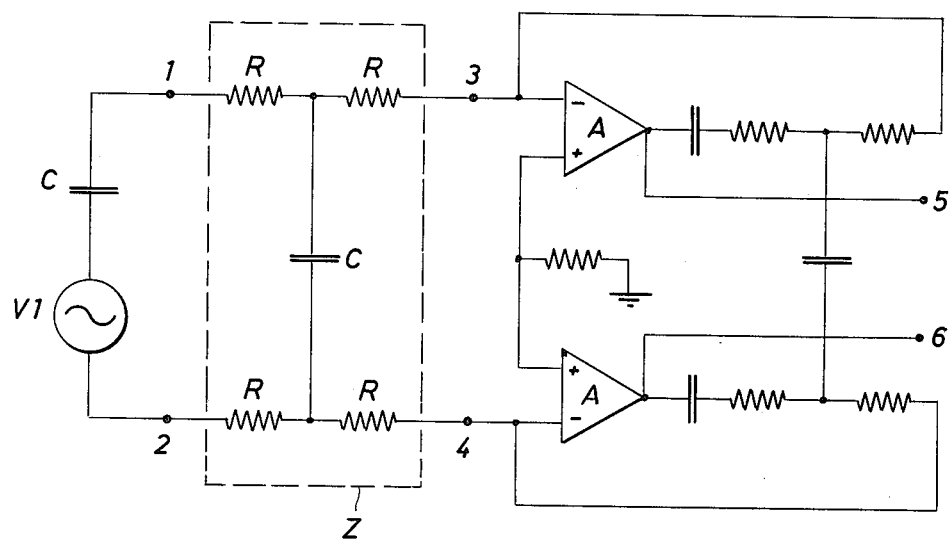
FIG. 3A is a simplified schematic of the seismic amplifier of the invention, together with an equivalent circuit of the cable pair.
Figure 3B:
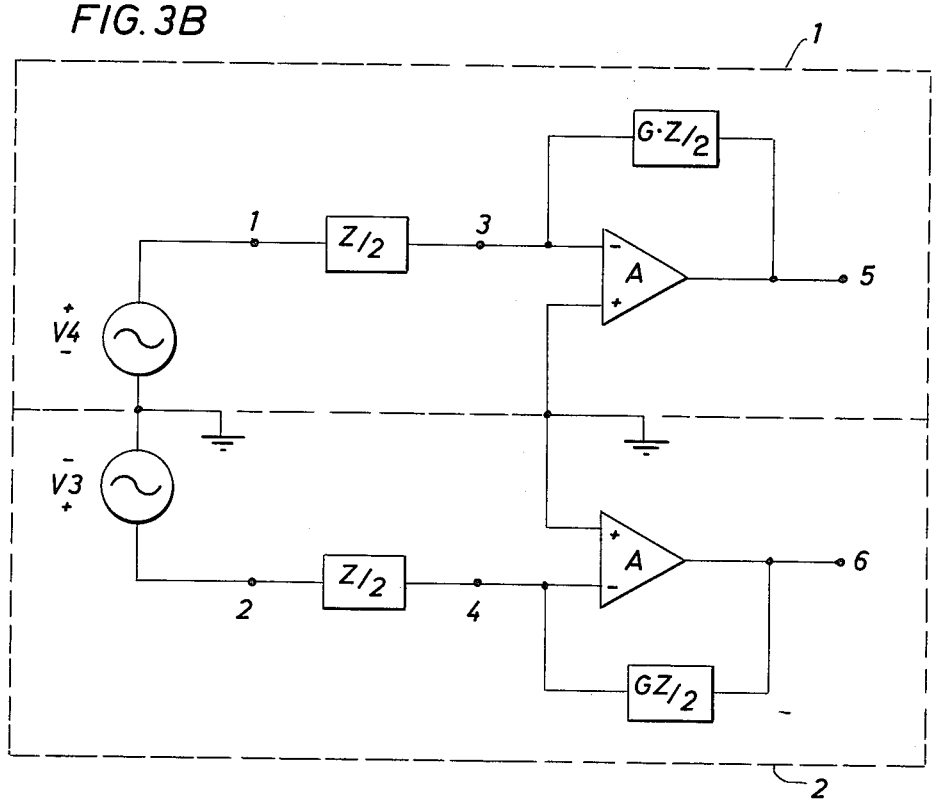
FIG. 3B is a schematic which simplifies the circuit of FIG. 3A by substituting the Thevenin equivalent impedances.

A low freqency lumped parameter equivalent for a cable pair, as taught by *Communications Engineering*, is illustrated in FIG. 7. The capacitance is equal to the distributed shunt capacitance of the cable pair and the sum of the resistance is equal to the distributed series resistance of the cable pair. If this composite impedance, which is also equivalent to the cable pair impedance at the input to a seismic amplifier, could be placed in the feedback circuit of the seismic amplifier, the ideal transmitted voltage signal would have no phase change or amplitude drop. FIG. 2A is a schematic representation of the hydrophone equivalent circuit 1 and transmission line lumped parameter equivalent circuit 2. FIG. 2B shows the Thevenin equivalent of FIG. 2A, where B1 is the Thevenin voltage modification factor and Z6 is the Thevenin equivalent impedance. An excellent discussion relative to obtaining the Thevenin equivalent of a transmission line is set out in *Communications Engineering,* pages 299 and 339. If Z6 of FIG. 2B is placed in the feedback circuit of an operational amplifier whose inputs are connected to terminals 7 and 8 of FIG. 2A, then the circuit of FIG. 1 would result and the amplitude and phase characteristics of the line response would be eliminated. However, common mode voltage effects in the single ended circuit of FIG. 1 make it necessary to use the differential circuit of the present invention, as shown in FIG. 3A. The theory described above applies to the circuit of the invention, as illustrated in FIG. 3B. The dashed lines of FIG. 3B divides the circuit of FIG. 3A into two identical operational amplifier circuits in order to facilitate an understanding of the feedback principle being used. Voltage source V1 of FIG. 3A has become the differentially balanced voltage sources V4 and V3 of FIG. 3B. Both of the circuits 1 and 2 of FIG. 3B are equivalents of the operational amplifier of FIG. 1, and the lumped parameter equivalent of the line impedance Z of FIG. 3A is depicted by $Z/2 + Z/2 = Z$, where impedance $Z/2$ is shown at the input and G times $Z/2$ is shown in the feedback to each amplifier A1 and A2 of FIG. 3B. G, as previously mentioned, is a proportionality function which may vary with frequency and may be made equal to unity or some other positive real number.

It should be apparent that where an alternative seismic transducer is used or where the equivalent transfer function of the balanced resistive-reactive network in the seismic amplifier may be maintained by arranging other passive impedance elements (e.g., resistances, capacitances, inductances) in various configurations or by using a combination of active elements (e.g., transistors, operational amplifiers) and passive elements in place of the network described, the primary objective of the invention will be satisfied.

What we claim is:

1. A marine seismic surveying system, wherein a transducer responsive to varying acoustic pressure produces a proportional varying electrical output which is electrically coupled to a cable pair to conduct electrical signals to a processing station, comprising a seismic amplifier coupled to said cable pair which comprises:
   two amplifier circuits, each amplifier circuit having negative and positive polarity inputs and an output;
   a feedback circuit having a series resistive-capacitive combination connecting each output of each amplifier circuit to its respective negative polarity input, forming two feedback loops;
   a capacitive impedance electrically connecting said feedback loops to one another;
   means connecting said cable pair to said lastmentioned negative polarity inputs;
   means connected to said positive polarity inputs for maintaining said inputs at the same potential;
   means disposed in said seismic amplifier for preventing oscillation of said seismic amplifier;
   means disposed in said seismic amplifier for improving DC stability;
   a differential amplifier having positive and negative polarity inputs and a final output; and
   means electrically connecting the outputs from said amplifier circuits to the positive and negative polarity inputs of the differential amplifier.

2. A marine seismic surveying system, wherein a transducer responsive to varying acoustic pressure produces a corresponding varying electrical output which is electrically coupled to a cable pair to conduct electric signals to a processing station, comprising a seismic amplifier coupled to said cable pair, which comprises:
   a feedback compensation amplifier stage having at least a positive input pair and a negative input pair and at least two outputs;
   a feedback circuit connecting said outputs to said negative input pair of said feedback compensation amplifier stage, said feedback circuit having an impedance combination which is an electrical equivalent of the combined impedance of said cable pair and said transducer;
   means connecting said cable pair to said negative input pair;
   means connected to said positive input pair for maintaining said positive input pair at the same potential;
   a differential voltage amplifier stage having positive and negative polarity inputs and a final output; and
   means electrically connecting at least two outputs from said feedback compensation amplifier stage to said positive and negative polarity inputs of said differential voltage amplifier stage.

3. A marine seismic surveying system according to claim 1, wherein said cable pair includes means for coupling to said amplifier circuit negative polarity inputs.

4. A marine seismic surveying system according to claim 3, wherein said means for coupling is an equalization network.

5. A marine seismic surveying system according to claim 2, wherein said cable pair includes means for coupling to said negative input pair.

6. A marine seismic surveying system according to claim 5, wherein said means for coupling is an equalization network.

7. A marine seismic surveying system according to claim 1, wherein a pair of operational amplifiers form said amplifier circuits.

8. A marine seismic surveying system according to claim 1, wherein said means for preventing oscillation of said seismic amplifier comprises a resistance disposed in series with said capacitive impedance.

9. A marine seismic surveying system according to claim 2, wherein said impedance combination is a balanced resistive-reactive network.

10. A marine seismic surveying system according to claim 1, wherein the sum of the resistance of said resistive-capacitive combination in said feedback loops is proportional to the cable pair series resistance, and the series capacitive impedance electrically interconnecting said feedback loops in said feedback circuit is proportional to the impedance of the cable pair shunt capacitance.

11. A marine seismic surveying system according to claim 10, wherein the capacitance of said series resistive-capacitive combination in each of said feedback loops is proportional to twice the capacitance of said transducer, whereby the total effect of said capacitance in both feedback loops on said seismic amplifier approximates the effect of the capacitance of said transducer.

12. A marine seismic surveying system according to claim 1, wherein said positive polarity inputs of said amplifier circuits are both connected to a single resistance which is connected to ground potential.

13. A marine seismic surveying system according to claim 1, wherein the resistance of said series resistive-capacitive combination in each feedback loop and said capacitive impedance electrically interconnecting said feedback loops form a network configured in a balanced-L relationship to approximate the total impedance of said cable pair.

14. A marine seismic surveying system according to claim 13, wherein said network is configured in a balanced-T relationship.

15. A marine seismic surveying system according to claim 2, wherein said feedback compensation amplifier stage comprises two amplifier circuits, each amplifier circuit having negative and positive polarity inputs and an output, said inputs forming said positive input pair and said negative input pair.

16. A marine seismic surveying system according to claim 15, wherein a pair of operational amplifiers form said amplifier circuits.

17. A marine seismic surveying system according to claim 9, wherein the reactive component of said balanced resistive-reactive network is capacitive, where each of said outputs are electrically coupled to said negative input pair through capacitances, each of whose value is proportional to twice the value of the capacitance of said transducer, whereby the total effect of said capacitances on said seismic amplifier approximates the effect of the capacitance of said transducer; and said last-mentioned outputs are electrically interconnected through a series resistive-capacitive impedance, where the capacitance of said resistive-capacitive impedance is proportional to said cable pair shunt capacitance, whereby the resistance of said resistive-capacitive impedance prevents oscillation of said seismic amplifier; and where the sum of the resistances in said feedback circuit excluding said last-mentioned resistance is proportional to said cable pair series resistance.

18. A marine seismic surveying system according to claim 2, wherein the inputs of said positive input pair are both connected to a single resistance which is connected to ground potential.

19. A marine seismic surveying system according to claim 9, wherein said resistive-reactive network forms a balanced-L network.

20. A marine seismic surveying system according to claim 9, wherein said resistive-reactive network forms a balanced-T network.

21. A marine seismic surveying system according to claim 1, wherein the means for improving DC stability is comprised of a resistance disposed in a parallel configuration with said capacitance of said series resistive-capacitive combination.

22. A marine seismic surveying system according to claim 17, wherein a resistance is disposed in a parallel configuration with each of said capacitances connecting said outputs to said negative input pairs for improving DC stability.

23. Apparatus according to claim 2, wherein the ratio of the value of said impedance combination and the value of said combined impedance is a positive real number, said positive real number representing the response function of said feedback compensation amplifier stage.

* * * * *